United States Patent [19]

Sugiura et al.

[11] Patent Number: 5,719,072
[45] Date of Patent: Feb. 17, 1998

[54] METHOD OF MANUFACTURING A SEMICONDUCTOR USING MULTI-LAYER ANTIREFLECTIVE LAYER

[75] Inventors: Souichi Sugiura, Yamato; Hidehiro Watanabe, Tokyo, both of Japan; Seiko Yoshida, Fishkill, N.Y.

[73] Assignee: Kabushiki Kaisha Toshiba, Kawasaki, Japan

[21] Appl. No.: 500,835

[22] Filed: Jul. 11, 1995

Related U.S. Application Data

[62] Division of Ser. No. 227,519, Apr. 14, 1994, Pat. No. 5,486,719.

[30] Foreign Application Priority Data

Apr. 15, 1993 [JP] Japan .................. 5-112194

[51] Int. Cl.⁶ .................................. H01L 21/314
[52] U.S. Cl. .............. 437/195; 437/229; 156/661.11
[58] Field of Search ........................... 437/195, 229, 437/235; 148/DIG. 137; 156/661.11

[56] References Cited

U.S. PATENT DOCUMENTS

| | | | |
|---|---|---|---|
| 3,884,698 | 5/1975 | Kakihama et al. | 117/217 |
| 4,070,689 | 1/1978 | Coleman et al. | |
| 4,910,122 | 3/1990 | Arnold et al. | 430/313 |
| 5,130,259 | 7/1992 | Bahraman | 437/5 |
| 5,219,788 | 6/1993 | Abernathey et al. | 437/187 |
| 5,285,102 | 2/1994 | Ying | 257/640 |
| 5,328,786 | 7/1994 | Miyazaki et al. | 430/5 |
| 5,441,914 | 8/1995 | Taft et al. | 437/189 |
| 5,486,719 | 1/1996 | Sugiura et al. | 257/641 |
| 5,580,701 | 12/1996 | Lun et al. | 430/316 |

FOREIGN PATENT DOCUMENTS

| | | |
|---|---|---|
| 60-240127 | 11/1985 | Japan . |
| 61-170067 | 7/1986 | Japan .................. 257/641 |
| 4-206817 | 7/1992 | Japan . |

OTHER PUBLICATIONS

R. Mehratra, et al. Proc. SPIE (Mar. 1991) vol. 1463, p. 487–491 (abstract only) "Reduction of the standing wave effect in positive photoresist using an ARC".

Z. Chem, et al. IEEE Trans. Elec. Dev. (Jun. 1993) 40(6) pp. 1161–1165 "A novel and effective PECVD $SiO_2$/Sin ARC for Si solar cells".

Primary Examiner—John Niebling
Assistant Examiner—C. Everhart
Attorney, Agent, or Firm—Banner & Witcoff, Ltd.

[57] ABSTRACT

In a semiconductor device according to this invention, a first insulating film formed on only a pattern formation conductive film on a semiconductor substrate and having a reflectance which is 25% or more and periodically changes in accordance with a change in film thickness of the first insulating film is formed on the semiconductor substrate. A second insulating film having a reflectance which is 25% or more and periodically changes in accordance with a change in film thickness and having a refractive index different from that of the first insulating film is formed on only the first insulating film. A total reflectance of the first and second insulating films is less than 25%. A photosensitive film is formed on the second insulating film and exposed through a reticle to form a predetermined pattern. Etching is performed using the photosensitive film having this pattern to form a conductive pattern.

22 Claims, 6 Drawing Sheets

0.7 —— 0.5 --- 0.3 —·—
0.6 —·· 0.4 --- 0.2 ——

0.7 —— 0.5 --- 0.3 —·—
0.6 —·· 0.4 --- 0.2 ——

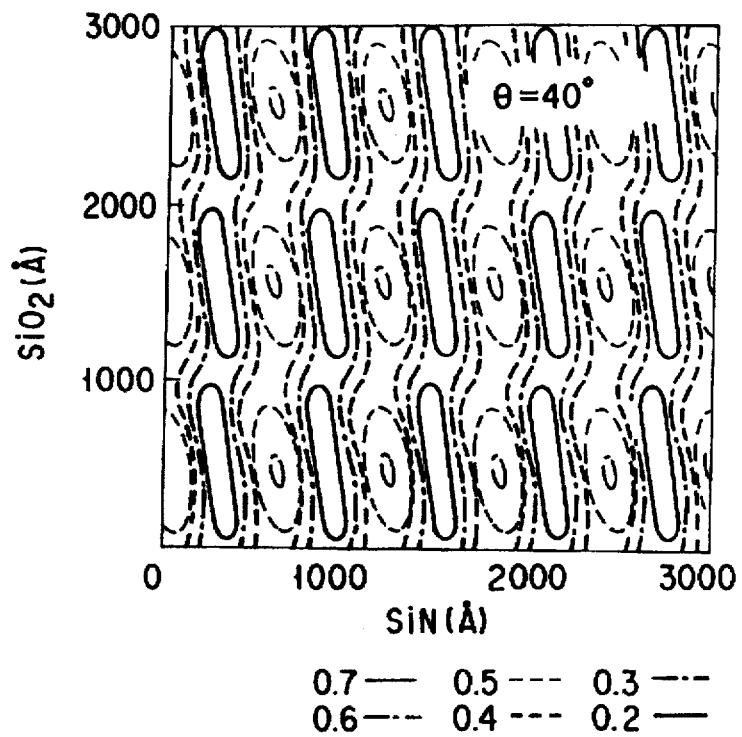
F I G. 11
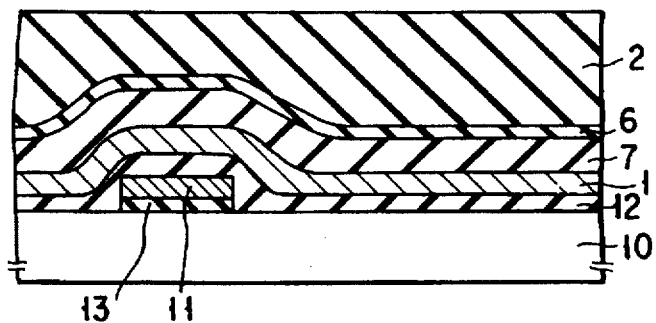
F I G. 12
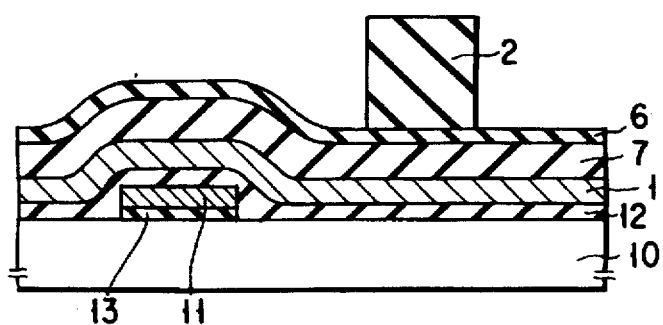
F I G. 13
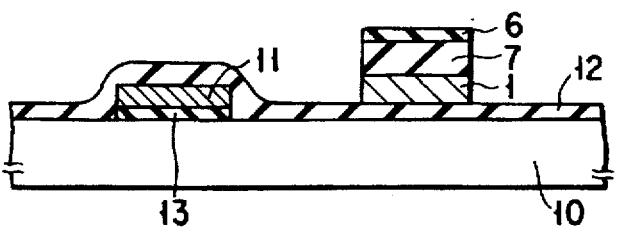
F I G. 14

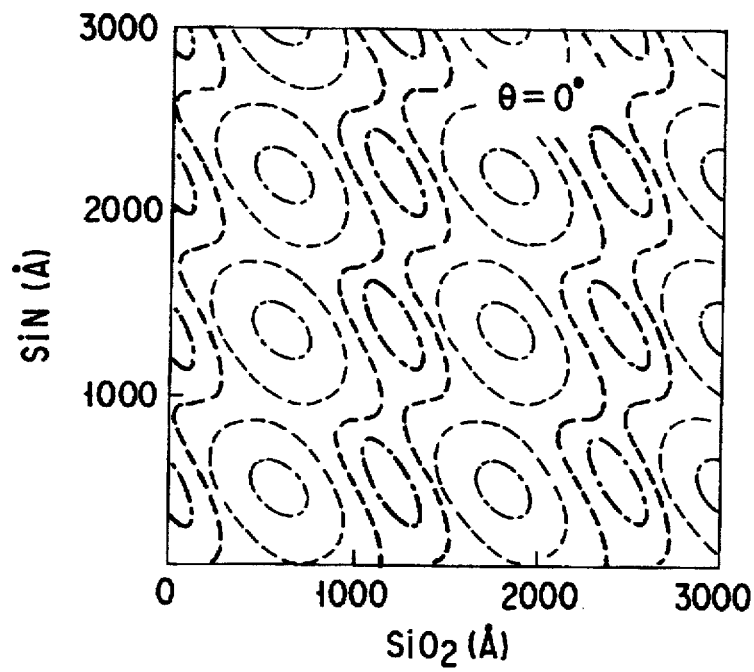
F I G. 15
0.7 ——  0.5 - - -  0.3 —·—
0.6 —··—  0.4 —·—  0.2 ——
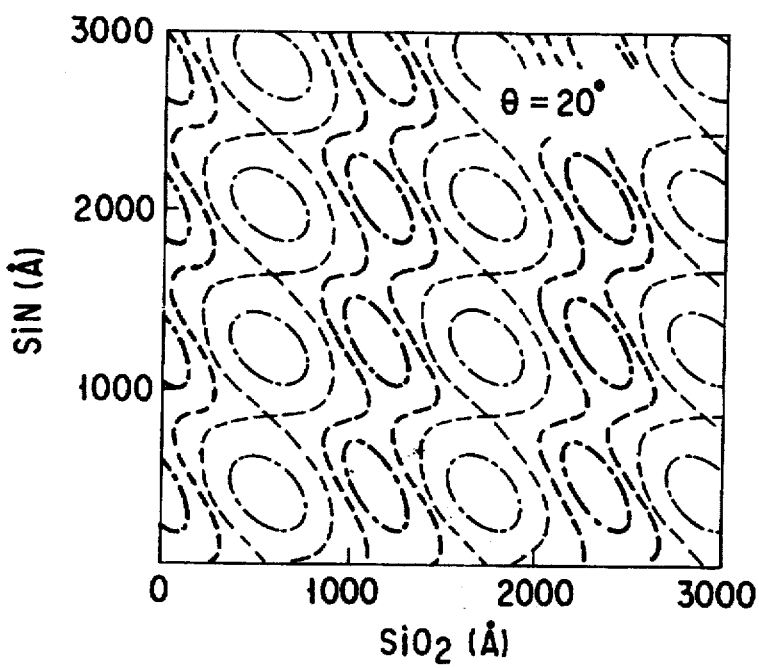
F I G. 16
0.7 ——  0.5 - - -  0.3 —·—
0.6 —··—  0.4 —·—  0.2 ——

METHOD OF MANUFACTURING A SEMICONDUCTOR USING MULTI-LAYER ANTIREFLECTIVE LAYER

This application is a division of application Ser. No. 08/227,519, filed Apr. 4, 1994, now U.S. Pat. No. 5,486,719.

BACKGROUND OF THE INVENTION

1. Field of the Invention

The present invention relates to a semiconductor device improved such that first and second insulating films each having a reflectance which is 25% or more and periodically changes in accordance with a change in film thickness are combined with each other and formed on a conductive layer formed on a semiconductor substrate to obtain a total reflectance of less than 25% of the first and second insulating films, and a method of manufacturing the same.

2. Description of the Related Art

In recent years, the integration density of a semiconductor device has considerably increased, and, in accordance with this, not only the degree of micropatterning of a circuit has increased, but also degree of micropatterning and the number of layers constituting a wiring multilayer have increased. For this reason, in a process of forming a pattern for a gate electrode or a wiring layer, the thickness and size of the pattern must be strictly controlled. In particular, in a photoetching process, although a mask pattern must be faithfully formed on the surface of a semiconductor substrate, when the degree of micropatterning increases as described above, pattern formation is adversely affected when light from a light source is slightly reflected in an exposing process. More specifically, when a conductive film such as a metal material on which a pattern is to be formed has a high reflectance with respect to the wavelength (to be referred to as an exposure wavelength hereinafter) of light from a light source for performing exposure, a more serious problem is posed. As the material of the mask pattern, a photosensitive film such as a photoresist film is used. Although this photoresist is exposed along a desired mask pattern by light directly incident on the surface 10 of the photoresist, the photoresist is actually exposed by light reflected by the pattern formation conductive layer. For this reason, when the pattern formation conductive layer has an uneven surface, the photoresist is exposed to have a shape different from that of the desired mask pattern because the optical path of light reflected by the uneven surface does not coincide with the optical path of the incident light.

As is apparent from the sectional view showing a step in manufacturing a conventional semiconductor device shown in FIG. 1, a metal layer 1 serving as a pattern formation conductive film is formed on a semiconductor substrate 10 consisting of silicon or the like through an insulating film 12, and a photoresist 2 is formed on the metal layer 1. A polysilicon electrode 11 is formed on the semiconductor substrate 10 through a gate oxide film 13 adjacent to the photoresist 2, and the metal layer 1 is formed on the polysilicon electrode 11 through the insulating film When light from a light source is radiated on the photoresist 2 through a reticle or photomask (not shown), the light is radiated on the photoresist 2 at an almost right angle. The irradiated portion is dissolved in a developing solution, and the photoresist portion not irradiated with light is not dissolved to be left as a mask pattern. This photoresist is called a positive type resist. A negative type resist in which an exposed portion is not dissolved in a developing solution may also be used. In any case, a material to be patterned is etched using the photoresist left on the semiconductor substrate as a mask. Therefore, the mask pattern must be formed to faithfully reproduce the reticle.

When light used for exposure is reflected by the underlying metal layer 1, the light is reflected in the incident direction as indicated by an arrow in a region A where the polysilicon film 1 has an even surface. However, in a region B having a portion in which the gate electrode 11 or the like is formed to form a stepped portion 3, the light is not reflected in the incident direction, and the reflected light propagates in an upper right direction (the direction of arrows shown in FIG. 1) and is radiated on a side surface portion of the photoresist 2. As a result, the side surface of the photoresist 2 left as the mask pattern is partially exposed to form a recessed portion 4. Due to the recessed portion 4, even when etching is performed using the developed photoresist 2 as a mask pattern to form a wiring layer by the underlying metal layer 1, a desired wiring pattern cannot be obtained, and disconnection of the wiring layer may occur in the worst case. In this manner, an accurate developing process for the photoresist cannot be easily performed near the uneven portion of the metal layer, and the above method cannot easily cope with a recent semiconductor device which has a higher degree of micropatterning and a larger number of layers constituting a multilayer.

As one method of solving the above problem, the following method as disclosed in U.S. Pat. No. 4,910,122 is known. That is, an anti-reflection film for decreasing the reflection amount of the conductive layer is deposited on the pattern formation conductive layer 1, and the photoresist 2 is coated on the anti-reflection film. For example, FIG. 2 is a sectional view showing a wiring portion on the semiconductor substrate for explaining an example of the above method. An anti-reflection film 5 which can be dissolved in an alkaline solution is spin-coated on the polysilicon film 1 formed on the semiconductor substrate 10 through the insulating film 12, an annealing process is performed for the resultant structure, and the photoresist 2 is coated on the anti-reflection film 5. This photoresist 2 is exposed and then developed in an aqueous alkaline solution. However, according to this method, since not only the photoresist 2 but also the anti-reflection film 5 serves as a mask together with the metal layer 1 serving as the pattern formation conductive layer, its processing accuracy is determined by the pattern of the anti-reflection film 5. However, the pattern size of the anti-reflection film 5 is not easily controlled because not only a dissolution amount of the anti-reflection film 5 must be controlled but also a change in thickness of the anti-reflection film 5 must be controlled. In addition, a method of inserting a metal layer or a metal compound layer for decreasing a reflectance between the metal layer 1 serving as the pattern formation conductive layer and the photoresist 2 is known in Jpn. Pat. Appln. KOKAI Publication No. 60-240127. However, according to this method, the following various problems are posed to avoid practical use of the semiconductor device. That is, film quality is made unstable after a pattern is formed, and a trouble occurs a subsequent process of performing a high-temperature process, and a special process of removing the metal layer or metal compound layer must be performed.

In addition, as described in U.S. Pat. No. 3,884,698, it is known that a conventional anti-reflection film has a single layer. In this anti-reflection film having the single layer, the minimum value of a reflectance which periodically changes in accordance with a change in film thickness is determined for each predetermined film thickness. For this reason, the reflectance is not easily decreased to 25% or less, and the reflectance is not easily changed by controlling the film thickness.

SUMMARY OF THE INVENTION

The present invention has been made in consideration of the above circumstances, and has as its object to provide a semiconductor device improved such that first and second insulating films each having a reflectance which is 25% or more and periodically changes in accordance with a change in film thickness are combined with each other and formed on a conductive layer formed on a semiconductor substrate to obtain a total reflectance of less than 25% of the first and second insulating films, thereby forming a highly accurate fine pattern, and a method of manufacturing the same.

In order to achieve the above object, according to an aspect of the present invention, a semiconductor device comprises:

a semiconductor substrate;

a conductive layer formed on the semiconductor substrate;

a first insulating film formed on only the conductive layer and having a reflectance which is not less than 25% and periodically changes in accordance with a change in film thickness; and a second insulating film formed on only the first insulating film, having a reflectance which is not less than 25% and periodically changes in accordance with a change in film thickness, and having a refractive index different from that of the first insulating film, the first and second insulating films having a total reflectance of less than 25%.

According to another aspect of the present invention, a method of manufacturing a semiconductor device comprises the steps of:

forming a conductive layer on a semiconductor substrate;

forming a first insulating film having a reflectance which is not less than 25% and periodically changes in accordance with a change in film thickness on the semiconductor substrate to cover the conductive layer; and forming a second insulating film having a reflectance which is not less than 25% and periodically changes in accordance with a change in film thickness and having a refractive index different from that of the first insulating film on the first insulating film, thereby obtaining a total reflectance of less than 25% of the first and second insulating films.

With the above arrangement, in the semiconductor device according to the present invention, the reflectance of a metal layer 1 serving as a pattern formation conductive layer having an uneven surface is decreased to less than 25% to suppress degradation of pattern accuracy caused by reflection, thereby increasing the pattern accuracy.

In the method according to the present invention, even when the surface of the semiconductor substrate has an uneven shape, an influence of reflected light on the photosensitive film caused by a change in reflection direction of the reflected light can be suppressed. In addition, since the anti-reflection film is constituted by two insulating films, the anti-reflection film need not be removed in a subsequent process, and these insulating films are left on a wiring layer or the like obtained by the pattern formation conductive layer and can be used to reinforce an insulating interlayer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a graph showing that, when the angle θ shown in FIG. 9 is 40°, and the first insulating film SiN and the second insulating film $SiO_2$ are used, a total reflectance of less than 25% can be obtained;

FIG. 12 is a sectional view showing the arrangement of a semiconductor device according to another embodiment of the present invention;

FIG. 13 is a sectional view showing a step in manufacturing the semiconductor device shown in FIG. 12;

FIG. 14 is a sectional view showing another manufacturing step next to the step in FIG. 13;

FIG. 15 is a graph showing that, when the angle θ between the insulating film 12 and the horizontal surface of the polysilicon film 1 shown in FIG. 7 is 0°, and a first insulating film $SiO_2$ and the second insulating film SiN according to an embodiment of the present invention are used, a total reflectance of less than 25% can be obtained;

FIG. 16 is a graph showing that, when the angle θ between the insulating film 12 and the horizontal surface of the polysilicon film 1 shown in FIG. 7 is 20°, and a first insulating film $SiO_2$ and a second insulating film SiN are used, a total reflectance of less than 25% can be obtained.

DETAILED DESCRIPTION OF THE PREFERRED EMBODIMENTS

An embodiment of the present invention will be described below with reference to the accompanying drawings.

Figure 1:
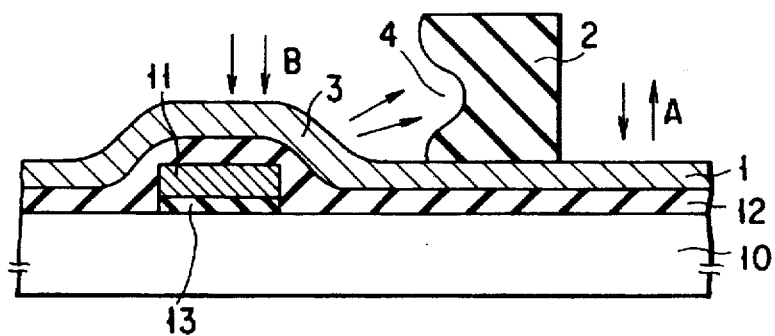
FIG. 1 is a sectional view showing a step in a method of manufacturing a conventional semiconductor device.
Figure 2:
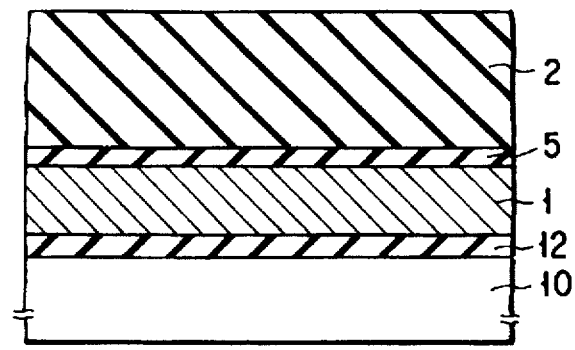
FIG. 2 is a sectional view showing another step in the method of manufacturing a conventional semiconductor device.
Figure 3:
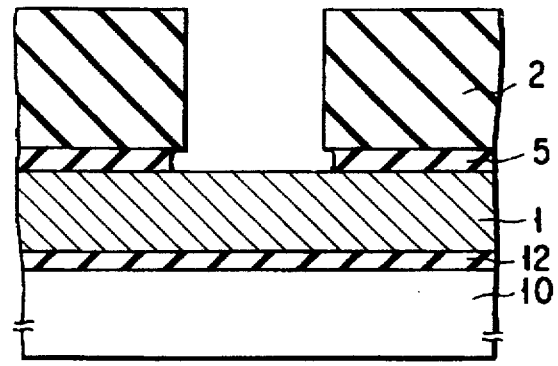
FIG. 3 is a sectional view showing a manufacturing step next to the step shown in FIG. 2.
Figure 4:
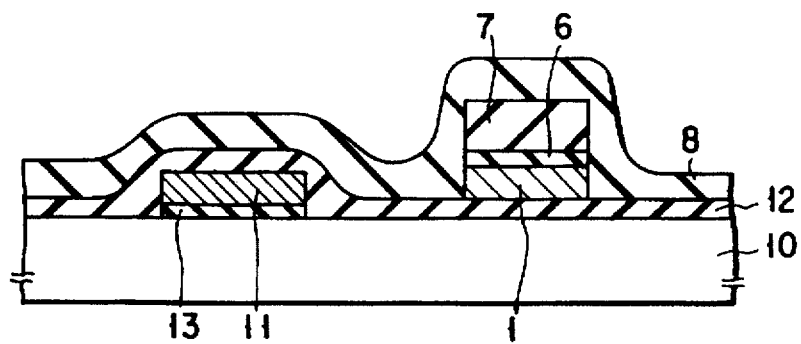
FIG. 4 is a sectional view showing the arrangement of a semiconductor device according to an embodiment of the present invention.
Figure 5:
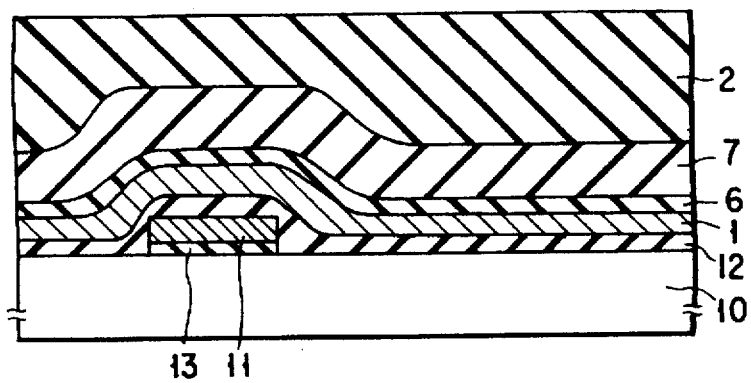
FIG. 5 is a sectional view showing a step in manufacturing a semiconductor device according to the present invention.
Figure 6:
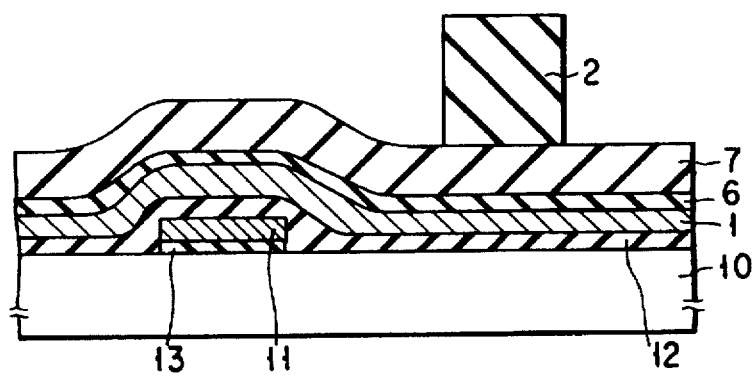
FIG. 6 is a sectional view showing another manufacturing step next to the step in FIG. 5.
Figure 7:
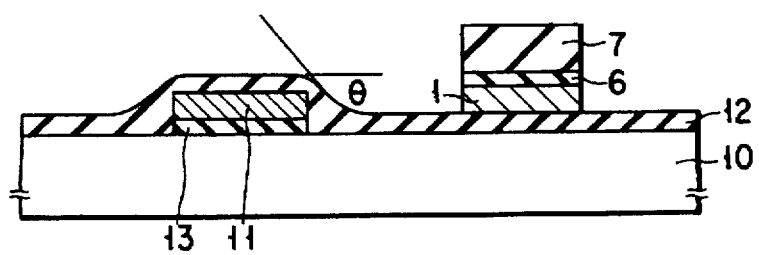
FIG. 7 is a sectional view showing still another manufacturing step next to the step in FIG. 6.
Figure 8:
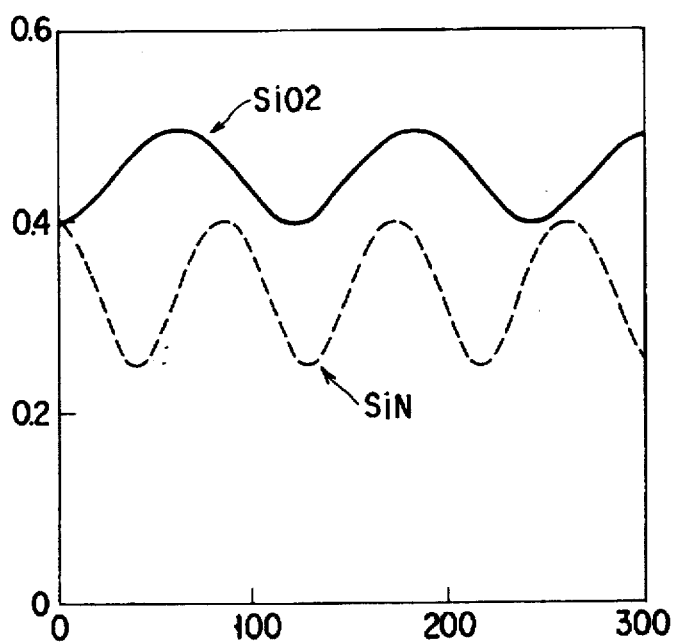
FIG. 8 is a graph showing that a reflectance periodically changing with a change in film thickness cannot be decreased to a predetermined value or less when a first insulating film SiN or a second insulating film $SiO_2$ is used.

The first embodiment will be described below with reference to FIGS. 4 to 11. FIG. 4 is a sectional view showing a semiconductor device, FIGS. 5 to 7 are sectional views showing the steps in manufacturing the semiconductor device in FIG. 4, FIGS. 9 to 11 are graphs showing the relationships between the thicknesses of insulating films and reflectances of light, and FIG. 8 is a graph showing dependency of the reflectance of each insulating film on the thickness of a corresponding insulating film. Referring to FIG. 4, on a semiconductor substrate 10 consisting of silicon or the like, for example, an insulating film 12 such as a $CVD-SiO_2$ film is formed to cover the uneven surface on which a gate electrode 11 consisting of polysilicon or the like and formed through a gate oxide film 13 and a field oxide film are formed. As shown in FIG. 5, a polysilicon film 1 serving as a pattern formation conductive film is formed on the entire surface of the insulating film 12 by CVD or the like. Thereafter, a silicon nitride film ($Si_3N_4$) 6 having a thickness of about 200 to 300 Å is deposited on the polysilicon film 1, and a silicon oxide ($SiO_2$) film 7 having a thickness of about 400 to 900 Å is deposited on the silicon nitride film 6. An i-beam photoresist 2 is coated on the silicon oxide film 7. As shown in FIG. 6, the resultant structure is exposed and developed through a mask by a stepper using a light source for emitting an i-beam having a wavelength of 365 nm to form a resist pattern from the photoresist 2.

Subsequently, anisotropic etching such as reactive ion etching (RIE) is performed using a resist pattern 2 as a mask to pattern the silicon nitride film 6 and the polysilicon film 1, thereby forming a polysilicon wiring layer 1 having a surface protected by the insulating films 6 and 7. As shown in FIG. 4, for example, an insulating film 8 such as a $CVD-SiO_2$ film is formed on the insulating substrate 10 to cover and protect the polysilicon wiring layer 1.

Figure 9:
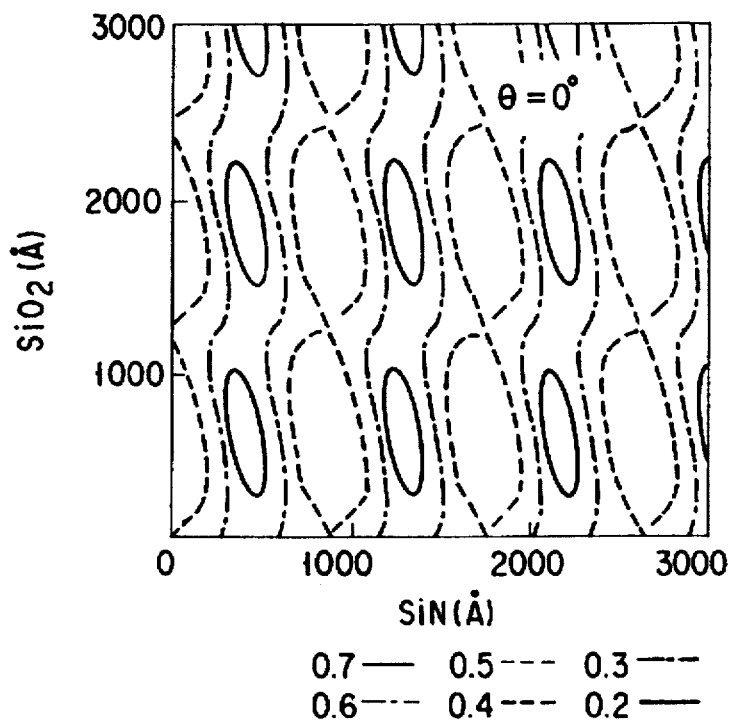
FIG. 9 is a graph showing that, when an angle θ between an insulating film 12 and the horizontal surface of a polysilicon film 1 shown in FIG. 7 is 0°, and the first insulating film SiN and the second insulating film $SiO_2$ according to an embodiment of the present invention are used, a total reflectance of less than 25% can be obtained.
Figure 10:
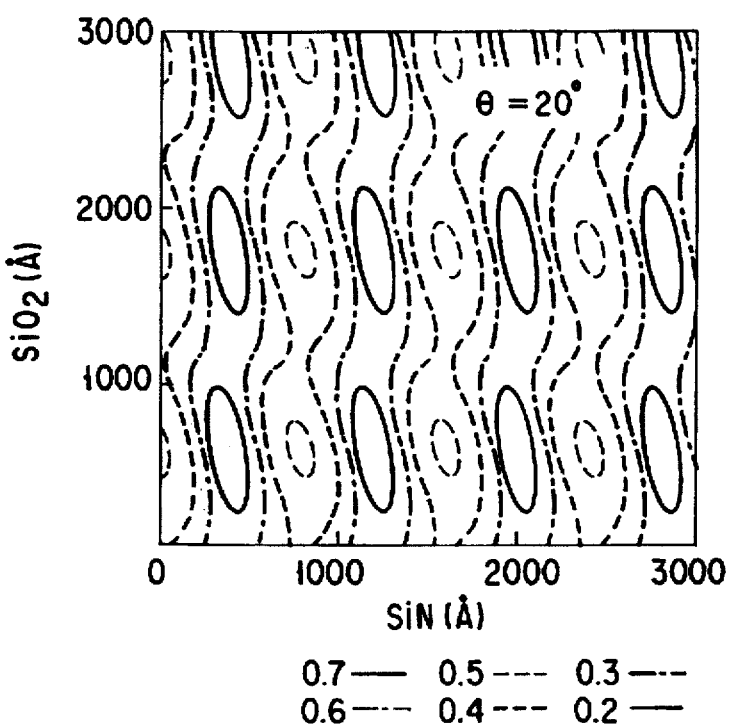
FIG. 10 is a graph showing that, when the angle θ shown in FIG. 9 is 20°, and the first insulating film SiN and the second insulating film $SiO_2$ are used, a total reflectance of less than 25% can be obtained.

A change in reflectance of the polysilicon film 1 of the pattern formation conductive film with changes in thicknesses of the silicon nitride film 6 and the silicon oxide film 7 will be described below with reference to FIGS. 9 to 11. For comparison, FIG. 8 shows the relationship between the reflectance of the surface of the polysilicon film 1 and the thickness thereof in the process of exposing a semiconductor device in which only a silicon nitride film or a silicon oxide film is interposed between the photoresist 2 and the polysilicon film 1 as an anti-reflection film. Referring to FIGS. 8 to 11, the silicon nitride film ($Si_3N_4$) is indicated by SiN, and the silicon oxide film is indicated by $SiO_2$.

The minimum reflectances of the silicon nitride film SiN and the silicon oxide film $SiO_2$ are 40% and 25%, respectively. In consideration of the reflectances, reflection of light can be more effectively prevented when only the silicon nitride film SiN is used as the anti-reflection film than when only the silicon oxide film $SiO_2$ is used. However, as shown in FIGS. 9 to 11, since the silicon nitride film SiN has a short period of 940 Å with respect to its film thickness, the film thickness cannot be easily controlled. In this manner, when the film $SiO_2$ or SiN was used as a single layer, a total reflectance of less than 25% could not be obtained.

In the present invention, the thicknesses of two insulating films having different characteristics are appropriately changed. For this reason, even when an angle between the surface of the pattern formation conductive film 1 on which a photosensitive film is formed and a horizontal plane appropriately changes, i.e., even when the pattern formation conductive film 1 has an uneven surface, the reflectance of the pattern formation conductive film can be suppressed to be low level. In addition, when the thickness of the insulating film having a short reflectance change period with respect to its film thickness is decreased, and the thickness of the insulating film having a long reflectance change period with respect to its film thickness is increased, a fluctuation in reflectance caused by the changes in thicknesses of the insulating films can be suppressed.

In this embodiment, according to the graphs in FIGS. 9 to 11, the thickness of the silicon nitride film 6 is decreased, and the thickness of the silicon oxide film 7 is increased. FIGS. 9 to 11 show cases wherein the angle θ between the surface of the polysilicon film 1 and the horizontal plane, which angle indicates a degree of unevenness, is set to be 0°, 20°, and 40°. In any case, the reflectance of the polysilicon film 1 can be suppressed to less than 25%. Although the reflectance periodically changes with respect to the thickness of each insulating film, the reflectance change period with respect to the silicon oxide film is longer than that with respect to the silicon nitride film. For example, when the angle θ between the surface of the polysilicon film and the horizontal plane is 0°, the period with respect to the thickness of the silicon nitride film SiN is about 900 Å, and the period with respect to the thickness of the silicon oxide film $SiO_2$ is about 1,240 Å. For this reason, when the film thicknesses are arbitrarily selected, a fluctuation of reflectance caused by the changes in film thickness can be suppressed by depositing the thick silicon oxide film 7 on the thin silicon nitride film 6.

The reflectance change period with respect to the thicknesses of the insulating films changes when the angle θ between the surface of the polysilicon film 1 and the horizontal plane changes. However, when the silicon oxide film 7 having a thickness of about 400 to 900 Å is deposited on the silicon nitride film 6 having a thickness of about 200 to 300 Å, and the thicknesses vary within the range of 10%, the reflectance can be suppressed to a small value. i.e., less than 25% at the angle θ of 0°, 20°, or 40°. When the silicon nitride film 6 has a thickness of 250 Å, the maximum reflectance, i.e., less than 30%, can be obtained. That is, even when the thickness of the silicon oxide film 7 changes, the reflectance slightly increases. For this reason, when the thickness of the silicon nitride film 6 is suppressed to fall within the range of 200 to 300 Å, the thickness of the silicon oxide film 7 can be arbitrarily set. In the semiconductor device according to the present invention, as shown in FIG. 4, the two insulating films 6 and 7 used as anti-reflection films are left on the wiring layer obtained from the pattern formation conductive layer 1 without any change. When the two insulating films 6 and 7 are deposited on the conductive metal layer 1 as described above, the insulating breakdown voltage of the conductive metal layer 1 is higher than that of the conductive metal layer 1 on which a single insulating layer is deposited. When the single insulating film is used, although a thermal oxide film having a high insulating breakdown voltage is formed on the side surface of the conductive layer 1 by an oxidation process performed after etching, the thermal oxide film is not formed on the upper surface of the conductive layer 1 because the single insulating film is formed on the upper surface. For this reason, a vertical insulating breakdown voltage is dependent on only the insulating breakdown voltage of an insulating interlayer. According to the present invention, since only the vertical insulating interlayer having a low breakdown voltage is constituted by two layers having a high breakdown voltage, the vertical insulating breakdown voltage can be increased like a horizontal insulating breakdown voltage.

Figure 17:
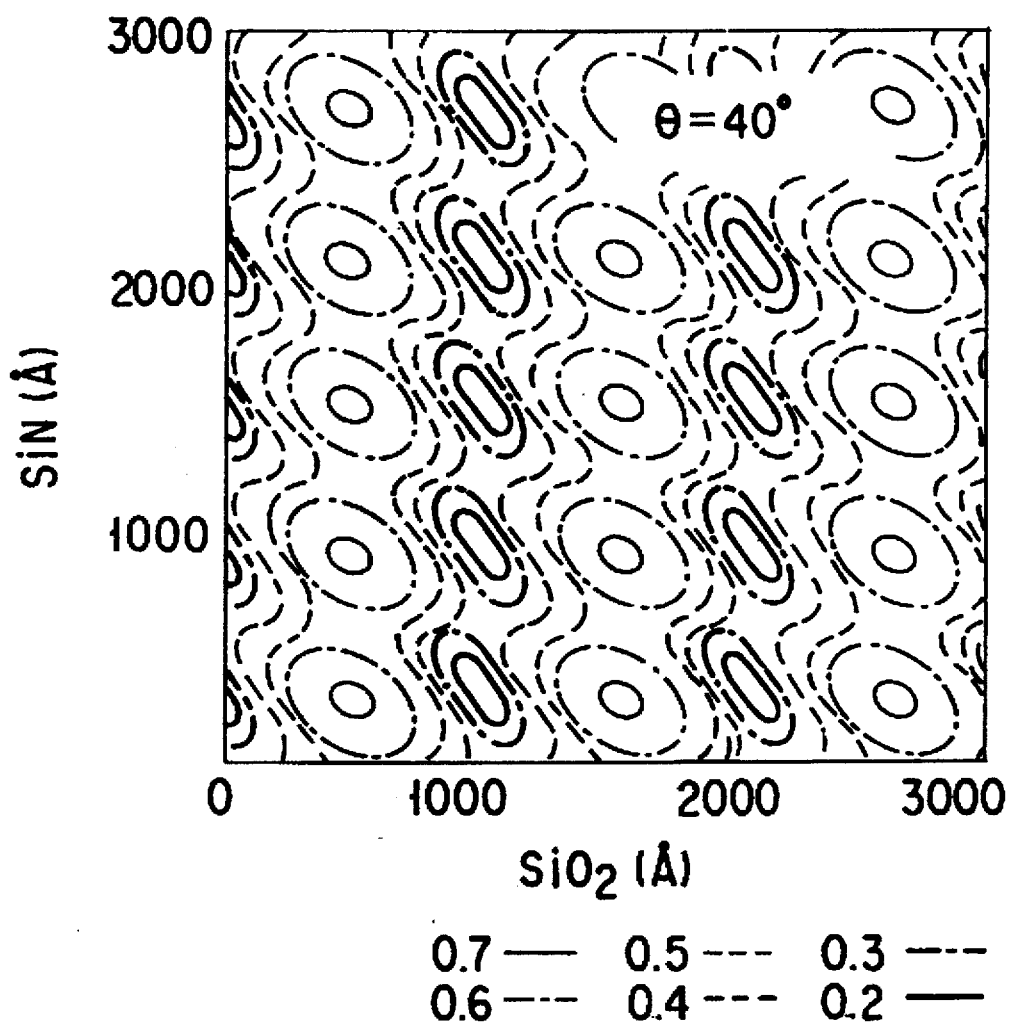
FIG. 17 is a graph showing that, when the angle θ between the insulating film 12 and the horizontal surface of the polysilicon film 1 shown in FIG. 7 is 40°, and the first insulating film $SiO_2$ and the second insulating film SiN are used, a total reflectance of less than 25% can be obtained.

The second embodiment will be described below with reference to FIGS. 12 to 14. FIG. 12 is a view showing a step in manufacturing a semiconductor device, and FIGS. 15 to 17 are graphs showing the relationships between the thicknesses of insulating films used in this embodiment and reflectances. An insulating film 12 such as a CVD-SiO$_2$ film, is formed on a semiconductor substrate 10 to cover the uneven surface of the semiconductor substrate 10 on which, e.g., a gate electrode 11 formed through a gate oxide film 13 and a field oxide film are formed. A polysilicon film 1 serving as a pattern formation conductive film is deposited on the entire surface of the insulating film 12 by CVD. Thereafter, a silicon oxide film 7 is deposited on the polysilicon film 1 to have a thickness of about 1,000 to 1,100 Å. A silicon nitride film 6 is deposited on the silicon oxide film 7 to have a thickness of about 200 to 400 Å. Thereafter, as shown in FIG. 12, an i-beam photoresist 2 is coated on the surface of the resultant structure. As shown in FIG. 13, the resultant structure is exposed and developed through a mask by a stepper using a light source for emitting an i-beam having a wavelength of 365 nm to form a resist pattern from the photoresist 2. Subsequently, as shown in FIG. 14, the silicon nitride film 6, the silicon oxide film 7, and the polysilicon film 1 are patterned by RIE or the like using the resist pattern 2 as a mask to form a polysilicon wiring layer 1 protected by the insulating films 6 and 7. Although not shown, for example, an insulating film such as a CVD-SiO$_2$ film is formed on the semiconductor substrate 10 to cover and protect the polysilicon wiring layer 1.

FIGS. 15 to 17 show changes in reflectances with respect to the thicknesses of a silicon oxide film SiO$_2$ and a silicon nitride film SiN according to this embodiment. When this embodiment is compared with the first embodiment, the minimum and maximum values of the reflectance increase to some extent. However, when an angle θ between the surface of the polysilicon film and the horizontal plane is 40°, the thicknesses of the insulating films can be combined with each other to obtain a reflectance of less than 25%. Therefore, the second embodiment is effective when the polysilicon film has an uneven surface. In addition, according to the reflectance change period with respect to the film thicknesses, an influence on the reflectance caused by a change in film thickness can be suppressed by depositing the thin silicon nitride film SiN on the thick silicon oxide film SiO$_2$. According to the present invention, although the two types of insulating films are used as described above, the combination of the insulating films is not limited to the combination of the silicon oxide film and the silicon nitride film. For example, films consisting of BPSG, PSG, alumina, and nitro-silicate glasses and a tantalum oxide film can be used, and these films can be appropriately combined with each other.

In each embodiment described above, a polysilicon film is used as a pattern formation conductive layer. However, according to the present invention, amorphous silicon, a silicide (e.g., molybdenum silicide or tungsten silicide), aluminum, an aluminum alloy, a refractory metal (e.g., tungsten or molybdenum), copper, or a copper alloy can be used as the material of the pattern formation conductive film. In addition, in the above embodiments, although a light source for emitting an i-beam is used as a light source used in an exposure process, light sources for emitting a g-ray, an excimer laser beam, an electron beam, and an X-ray can be used. One of the light sources is used, and two insulating films having different refractive indices are deposited between the pattern formation conductive layer and a photosensitive film matched with the corresponding light source to have thicknesses such that the reflectance of the conductive layer with respect to the wavelength of the light source is lower than that of a conductive film having a single insulating film when the film thicknesses change within the range of about 10% and even when the angle θ changes within the range of 0° to 40°. Thereafter, exposure may be performed using the light source.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
    forming a conductive layer on a semiconductor substrate;
    forming a first insulating film on said conductive film, said first insulating film having a reflectance which is 25% or more for an exposing light and which periodically changes in accordance with a change in the thickness of said first insulating film;
    forming a second insulating film on said first insulating film, said second insulating film having a reflectance which is 25% or more for the exposing light and which periodically changes in accordance with a change in the thickness of said second insulating film, said second insulating film further having a refractive index different from a refractive index of said first insulating film, wherein a total reflectance of said first and second insulating films is less than 25%;
    forming a photosensitive film on said second insulating film;
    partially exposing said photosensitive film with the exposing light and using said first and second insulating films as an antireflective film, and developing said photosensitive film, thereby forming a mask; and
    selectively etching said second and first insulating films and said conductive layer using said mask to form a pattern in said conductive layer.

2. A method according to claim 1, wherein said first insulating film is a silicon nitride film, and said second insulating film is a silicon oxide film.

3. A method according to claim 1, wherein said first insulating film is a silicon oxide film, and said second insulating film is a silicon nitride film.

4. A method according to claim 1, wherein each of said first and second insulating films has a reflectance which is 25% or more and periodically changes in accordance with a change in film thickness, and a thickness of one insulating film having a larger reflectance change period is increased.

5. A method according to claim 1, wherein the step of forming a first insulating film and the step of forming a second insulating film comprise forming, of said first and second insulating films, one insulating film having a higher reflectance and a larger thickness on the other insulating film.

6. A method of manufacturing a semiconductor device including a process of forming a pattern by photoetching, comprising the steps of:

forming a conducting layer having an uneven upper surface on a semiconductor substrate;

forming a first insulating film on said conducting layer, said first insulating film having a reflectance which is 25% or more for an exposing light for photoetching and which periodically changes with changes in the thickness of said first insulating film;

forming a second insulating film on said first insulating film, said second insulating film having a reflectance which is 25% or more for the exposing light and which periodically changes with a change in thickness of said second insulating film and having a refractive index different than that of said first insulating film, whereby said first and second insulating films have a total reflectance of less than 25% when an angle θ, representing a degree of unevenness between the upper surface of said conductive layer and a horizontal plane, ranges between 0° and 40°;

forming a photosensitive film on said second insulating film;

partially exposing the photosensitive film with the exposing light and using said first and second insulating films as an antireflective layer, and developing the photosensitive film, thereby forming a mask; and selectively etching the second and first insulating films, and conductive layer, using the mask, to form a pattern in the conductive layer.

7. A method according to claim 6, wherein said first insulating film is a silicon nitride film ($Si_3N_4$) having a thickness of 200 (±10%) to 300(±10%) Å and said second insulating film is a silicon dioxide film ($SiO_2$).

8. A method according to claim 6, wherein said first insulating film is a silicon nitride film ($Si_3N_4$) having a thickness of 200 (±10%) to 300 (±10%) Å, and said second insulating film is a silicon dioxide film ($SiO_2$) having a thickness of 400 (±10%) to 900 (±10%) Å.

9. A method according to claim 6, wherein said first insulating film is a silicon dioxide film ($SiO_2$) having a thickness of 1,000 (±10%) to 1,100 (±10%) Å, and said second insulating film is a silicon nitride film ($Si_3N_4$).

10. A method according to claim 6, wherein said first insulating film is a silicon dioxide film ($SiO_2$) having a thickness of 1,000 (±10%) to 1,100 (±10%) Å, and said second insulating film is a silicon nitride film ($Si_3N_4$) having a thickness of 200 (±10%) to 400 (±10%) Å.

11. A method according to claim 6, wherein the reflectance of one of said first and second insulating films has a larger change period and a larger thickness.

12. A method according to claim 6, wherein the step of forming a first insulating film and step of forming a second insulating film are carried out such that one of said first and second insulating films has a higher reflectance and a larger thickness than the other insulating film.

13. A method of manufacturing a semiconductor device, comprising the steps of:

forming a layer on a substrate;

forming on said layer an antireflecting film having a reflectance less than 25% for light from a light source, said antireflecting film comprising first and second insulating films each having a reflectance of at least 25% for the light;

forming a patterned photosensitive film on said antireflecting film; and etching said antireflecting and said layer using the patterned photosensitive film as a mask.

14. A method according to claim 13, wherein said layer is a layer having an uneven upper surface.

15. A method according to claim 14, wherein the reflectance of said antireflecting film is less than 25% for angles θ between 0° and 40°, where θ represents a degree of unevenness between the upper surface of said layer and a horizontal plane.

16. A method according to claim 13, wherein said first insulating film is a silicon nitride ($Si_3N_4$) film formed on said layer and said second insulating film is a silicon dioxide ($SiO_2$) formed on said silicon nitride film.

17. A method according to claim 16, wherein the thickness of said silicon nitride film is between about 200 and 300 Å and the thickness of said silicon dioxide film is between about 400 and 900 Å.

18. A method according to claim 13, wherein said light source is an i-beam light source emitting light having a wavelength of 365 nanometers.

19. A method according to claim 13, wherein said layer is a conductive layer.

20. A method according to claim 13, wherein said first insulating film is a silicon dioxide ($SiO_2$) film formed on said layer and said second insulating film is a silicon nitride ($Si_3N_4$) layer.

21. A method according to claim 20, wherein the thickness of said silicon dioxide film is between about 1000 and 1100 Å and the thickness of said silicon nitride film is between about 200 and 400 Å.

22. A method according to claim 13, wherein said first and second insulating films are insulating films selected from a group consisting of silicon nitride; silicon dioxide; BPSG, PSG, alumina, and nitrosilicate glasses; and tantalum oxide.

* * * * *